United States Patent [19]

Bouchant

[11] Patent Number: 4,491,974
[45] Date of Patent: Jan. 1, 1985

[54] RECEIVER HAVING A LIGHT EMITTING DISPLAY AS FREQUENCY AND TUNING INDICATOR

[75] Inventor: Jean C. Bouchant, Paris, France

[73] Assignee: Thomson-Brandt, Paris, France

[21] Appl. No.: 411,957

[22] Filed: Aug. 26, 1982

[30] Foreign Application Priority Data

Aug. 31, 1981 [FR] France ................................ 81 16545

[51] Int. Cl.³ .............................................. H04B 1/16
[52] U.S. Cl. ..................................... 455/159; 340/704
[58] Field of Search ........................ 455/158, 159, 154; 340/701, 703, 704, 753

[56] References Cited

U.S. PATENT DOCUMENTS

| | | |
|---|---|---|
| 3,882,399 | 5/1975 | Karpowycz . |
| 3,896,386 | 7/1975 | Ohsawa ............................... 455/159 |
| 3,987,401 | 10/1976 | Irving ................................... 455/159 |
| 4,039,956 | 8/1977 | Shimanek et al. .................. 455/159 |
| 4,165,500 | 8/1979 | Misawa . |
| 4,348,666 | 9/1982 | Ogita ................................... 455/159 |

FOREIGN PATENT DOCUMENTS

| | | |
|---|---|---|
| 2741506 | 3/1979 | Fed. Rep. of Germany . |
| 2944915 | 5/1981 | Fed. Rep. of Germany . |
| 136855 | 10/1979 | Japan ................................... 455/159 |

OTHER PUBLICATIONS

"Chip changes the Colors of Light-Emitting Diodes", by Burke, Electronics, Apr. 7, 1981, vol. 54, No. 7, (340/704).

"Radiomentor Electronic", Année 44, No. 9, 9/1978, Munich (DE), H. Forster, "FM-Radioskala mit Leds", pp. 342-343.

Primary Examiner—Jin F. Ng
Attorney, Agent, or Firm—Cushman, Darby & Cushman

[57] ABSTRACT

A receiver having a light emitting display device indicating the frequency to which the receiver is tuned and the presence or absence of a received signal by the use of visually distinct display modes. In one embodiment, a first color indicates no received signal and a second color display indicates the presence of a received signal. In another embodiment, a first color indicates no received signal, a second color indicates approximate tuning and a third color indicates exact tuning of a received signal.

18 Claims, 11 Drawing Figures

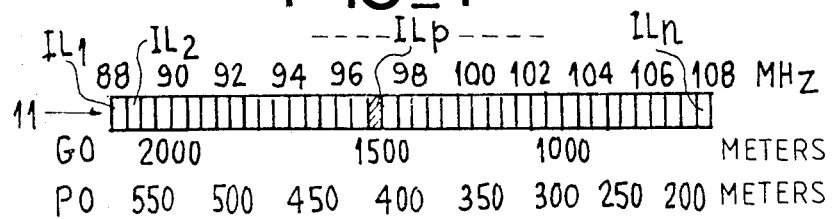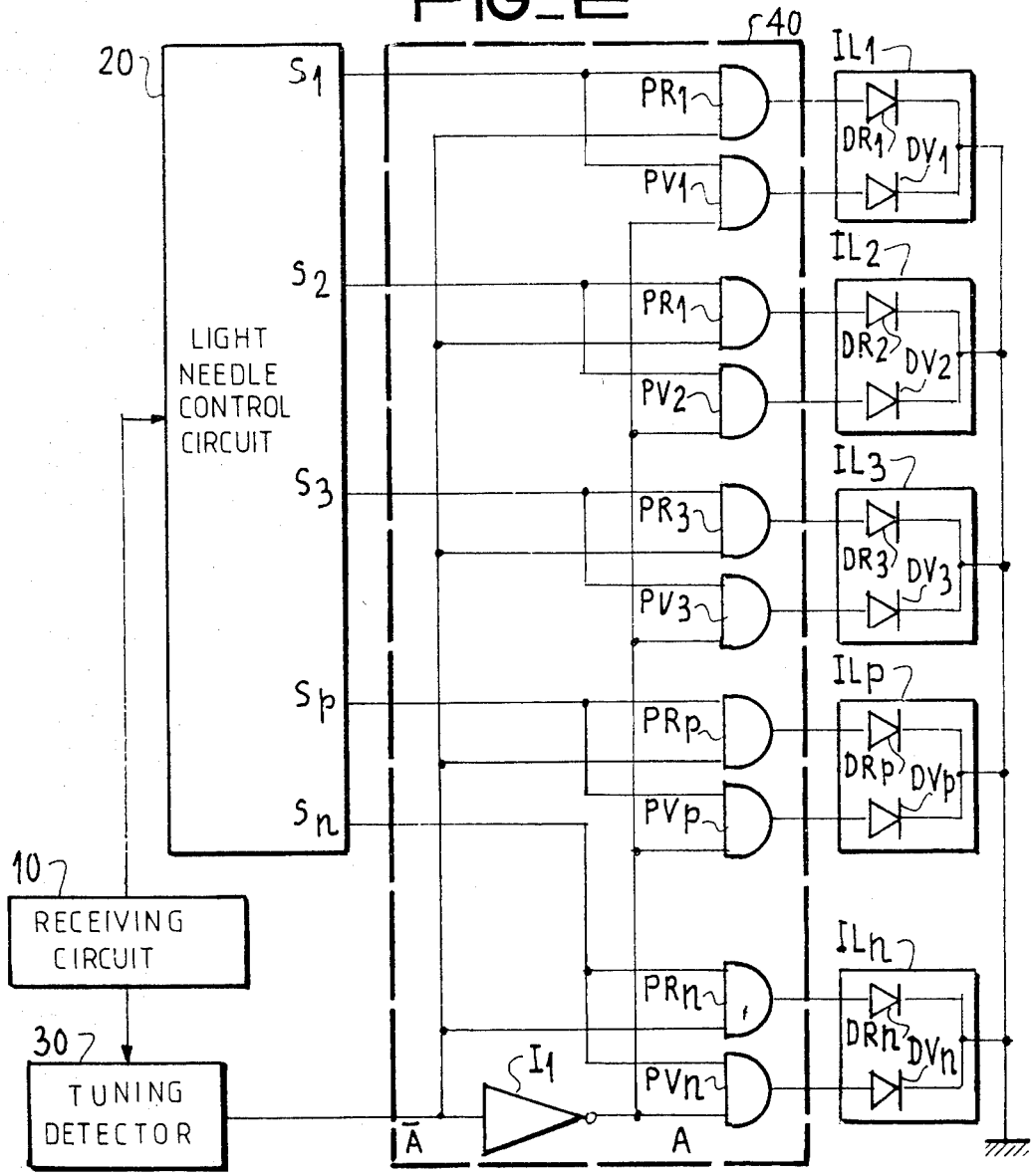

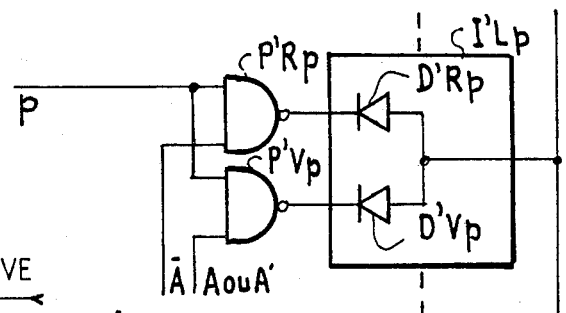
FIG_3
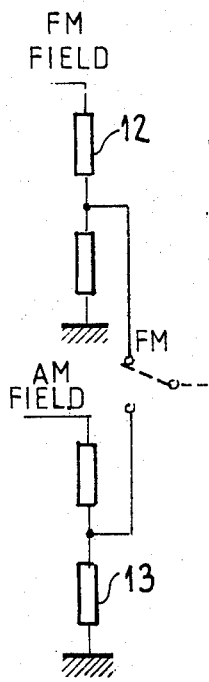
FIG_4
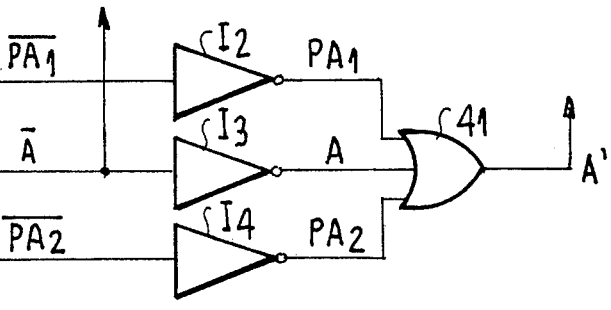
FIG_5
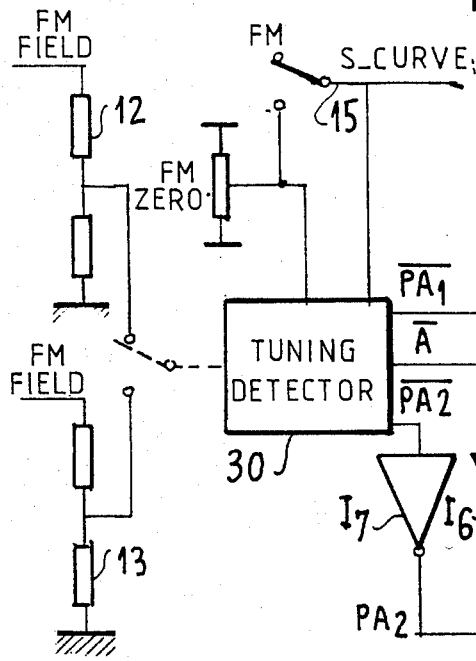
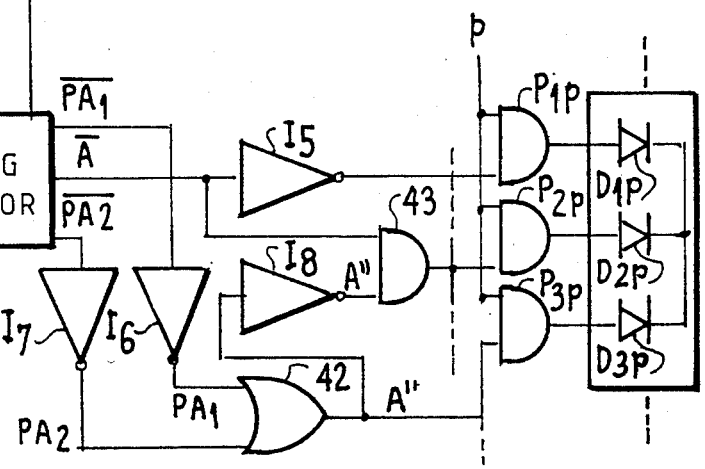

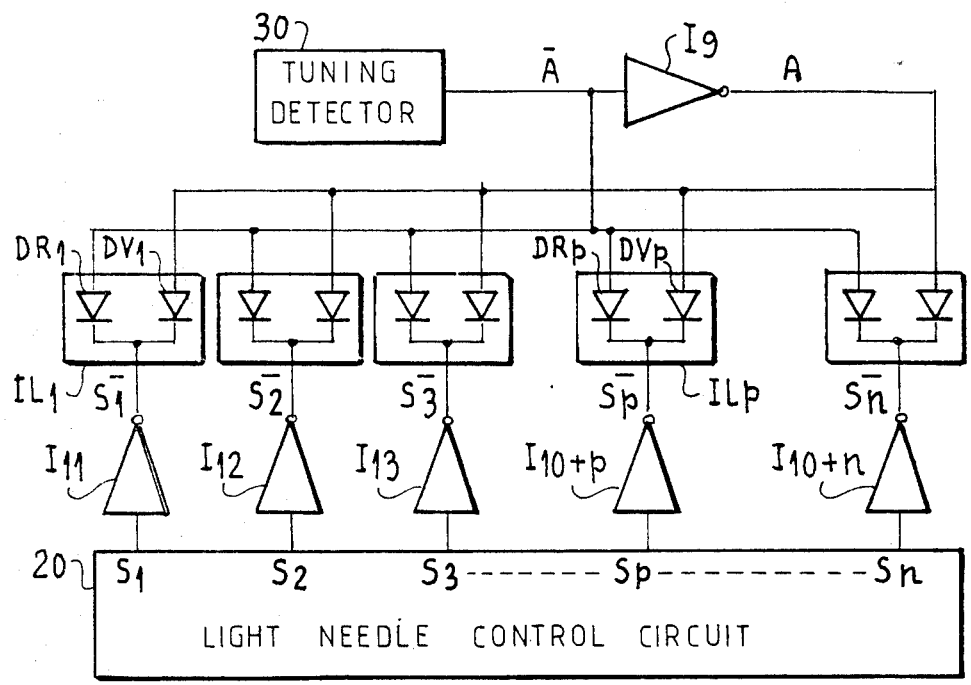
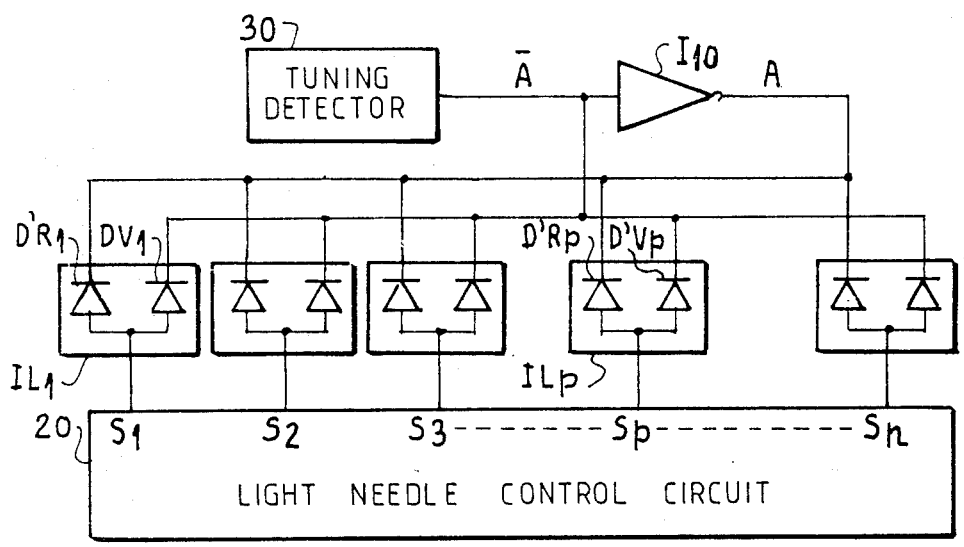

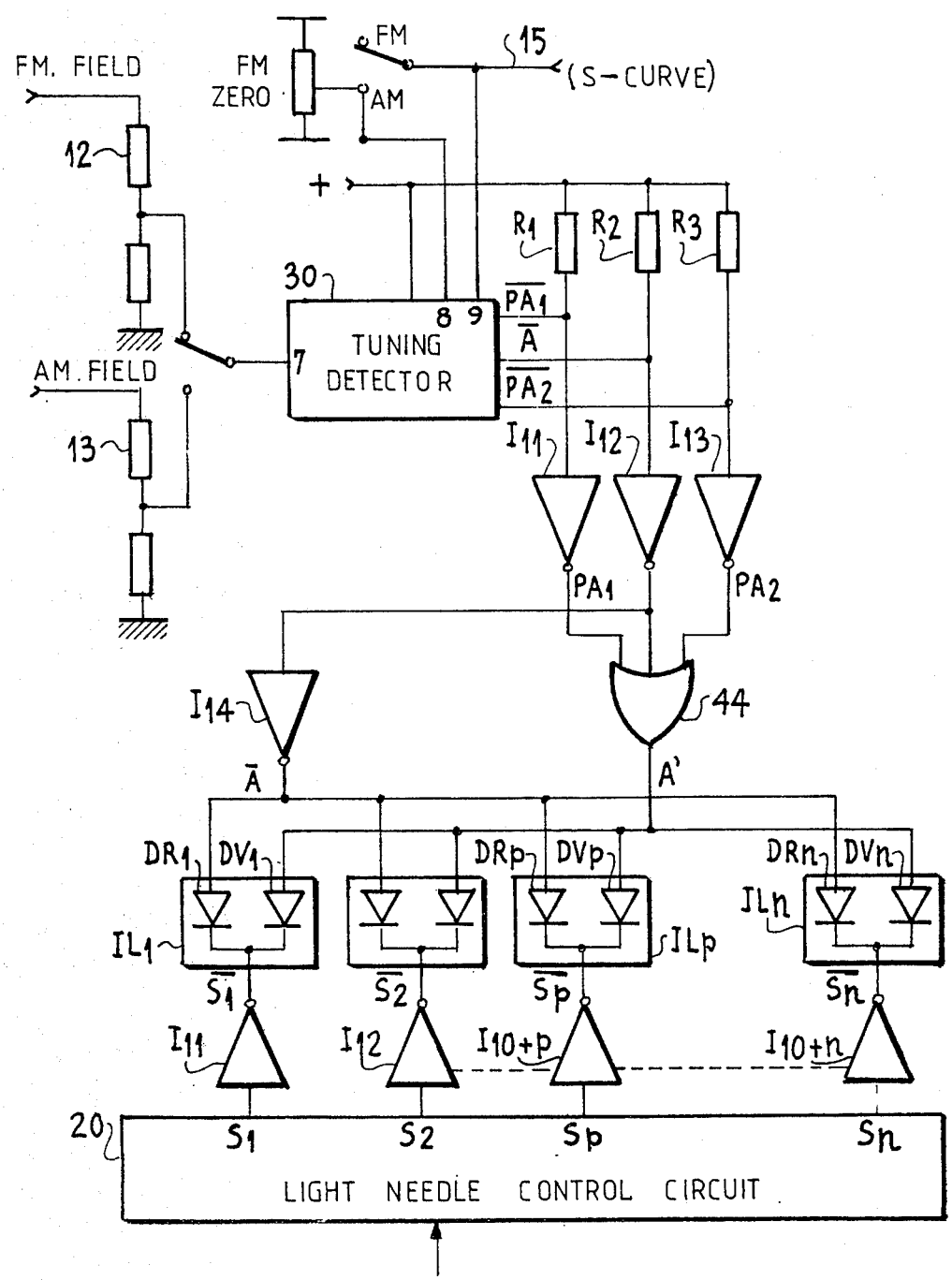

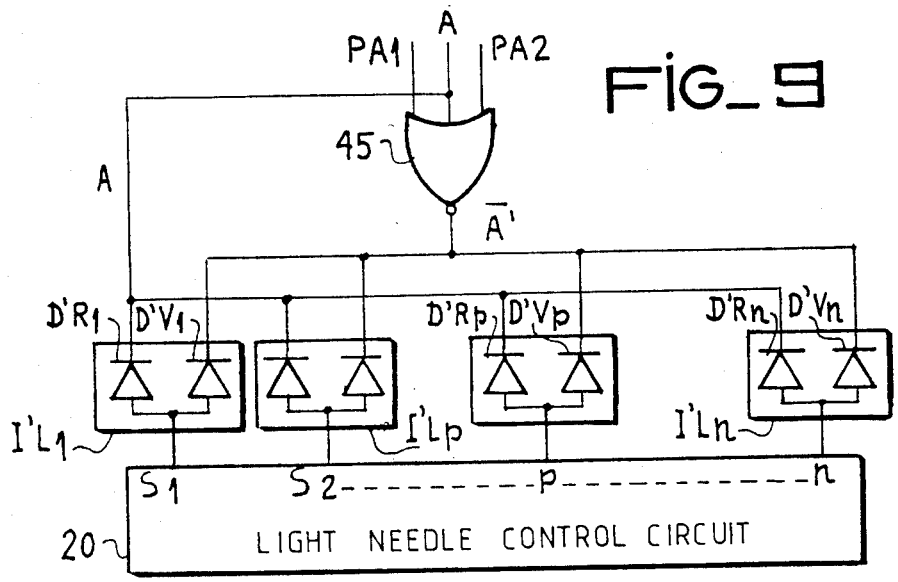
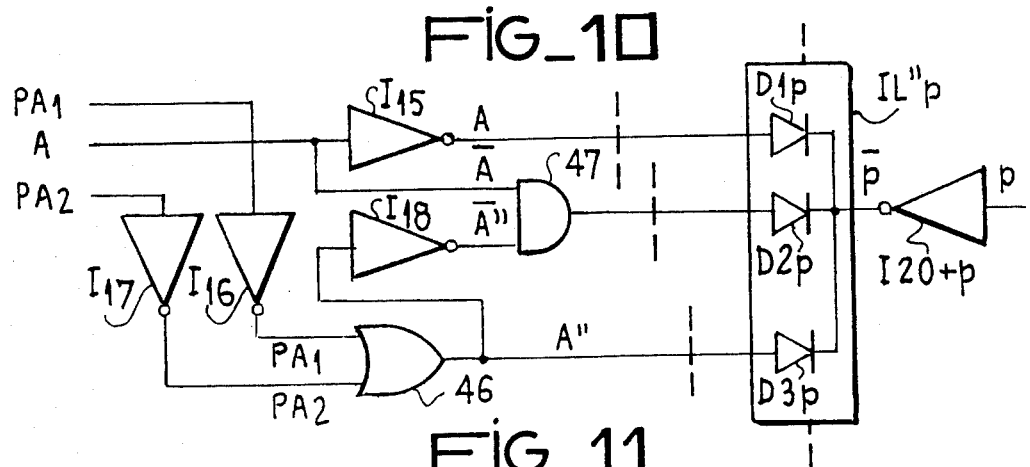
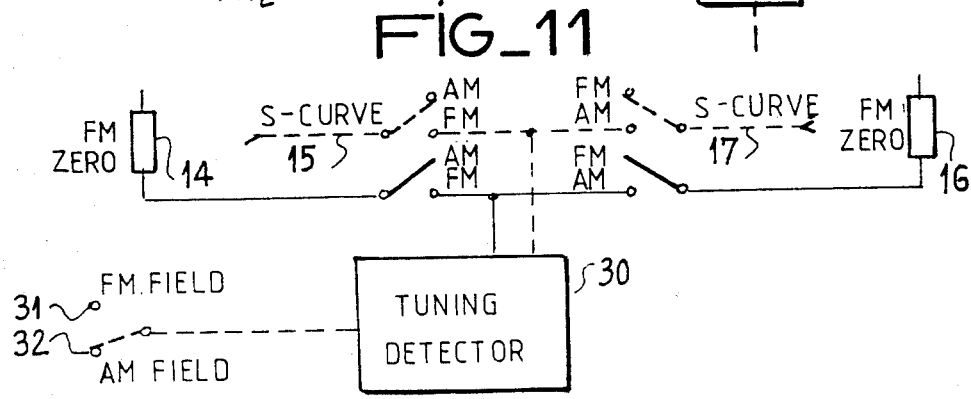

4,491,974

RECEIVER HAVING A LIGHT EMITTING DISPLAY AS FREQUENCY AND TUNING INDICATOR

BACKGROUND OF THE INVENTION

The present invention relates to a receiver comprising a frequency display device.

Amplitude modulation (AM) and/or frequency modulation (FM) receivers are in general equipped with a frequency display device formed of a frequency graduated dial and a needle integral with the system for tuning in the station (variable capacitor, variable inductance, voltage control of a Varicap diode). In the case of station tuning using one or more Varicap diodes, it is advantageous to use a frequency and wavelength graduated dial associated with a frequency device of the electronic light needle type which is generally an array of light-emitting diodes, associated with a control circuit. A single diode is lit up, controlled by a threshold element indicating the frequency on the dial, after calibration.

Whatever the mode of reference marking used, it is important to set the receiver exactly to the frequency of the transmitter. For that, use must be made of a tuning indicator. This may be a simple galvanometer with middle point or a more or less sophisticated electronic system.

These known systems have the drawback that the user is forced to look alternately at the tuning indicator and at the dial of the apparatus where the frequency indication is given.

The present invention has as its object a receiver free of the above drawback.

SUMMARY OF THE INVENTION

The invention thus provides a receiver comprising a receiving circuit, a tuning detector and a frequency display device, wherein the tuning detector is associated with the frequency display device so that the frequency display appears in a first mode in the absence of a signal from the tuning detector and representing tuning in to a station and in a second mode visually distinct from the first one in the presence of such a signal.

According to one embodiment of the invention, in the presence of a signal representing tuning to a station, said tuning detector is associated with the frequency display device so that the display appears on the dial according to the second mode in the presence of a signal associated with an exact or presumed exact tuning and according to a third mode visually distinct from the first two in the presence of a signal associated with an approximate tuning.

The frequency display device may comprise a display control circuit and a frequency light display device.

According to a preferred embodiment, said indication modes consist of distinct colors.

Thus, the frequency light display device may consist of a light needles comprising a plurality of display elements each of which is capable of causing an indication to appear in at least two distinct colors and be associated with a light needle control circuit receiving from the receiving circuit of the receiver a control voltage representative of the frequency to which the receiver is tuned and producing accordingly at one of its n outputs a signal representative of said frequency, the tuning detector receiving from said receiving circuit a signal representing the field received and/or at least one signal from a discriminator of said receiving circuit. Each display element may be formed for example from two or even three light emitting components, for example diodes.

Further, for amplitude modulation transmission, the tuning detector receives from the receiving circuit the amplitude modulation field and/or the zero and the S curve of an amplitude modulation discriminator.

For frequency modulation transmission, the tuning detector receives from the receiving circuit at least the zero of the discriminator and possibly the S curve of this latter and/or the frequency modulation field.

BRIEF DESCRIPTION OF THE DRAWINGS

The invention will be better understood from the following description, given by way of non limiting example with reference to the accompanying drawings in which:

FIG. 1 shows a graduated dial of the light needle type;

FIGS. 2 to 5 show embodiments of the invention each using a light-emitting diode array, associated with a logic circuit in parallel logic;

FIGS. 6 to 10 show embodiments of the invention each using a light-emitting diode array in series logic;

FIG. 11 shows a variation where the receiving circuit of the receiver is provided with an amplitude modulation and frequency modulation discriminator.

DESCRIPTION OF THE PREFERRED EMBODIMENTS

FIG. 1 shows a frequency light display device 11 of the light needle type comprising a number of light-emitting components($IL_1$, $IL_2$; ..., $IL_p$, ... $IL_n$). Such a light needle may be formed from an array of light-emitting diodes. The light needle is associated with graduations corresponding respectively to the frequency modulation band FM and to one or more amplitude modulation bands (long waves, medium waves etc.). The light indication is obtained by lighting a single one of the components, e.g. component $IL_p$, p being variable from 1 to n.

For such a display, the receiver comprises conventionally a receiving circuit as well as a display control circuit. A conventional receiver also comprises in general a tuning detector which provides a tuning display, independently of the frequency display.

FIG. 2 shows a receiver in accordance with the invention comprising a receiving circuit 10 which supplies, in a way known per se, one or more signals to a tuning detector 30, as well as a control voltage to a light needle control circuit 20. The frequency light display device 11 is of the light needle type, where each light-emitting element ($IL_1$, $IL_2$, ..., $IL_p$, ... $IL_n$), comprises two light-emitting components, for example diodes $DR_1$ and $DV_1$, $DR_2$ and $DV_2$, $DR_3$ and $DV_3$ ..., $DR_p$ and $DV_p$, ... $DR_n$ and $DV_n$. For example, diodes $DR_p$, with p varying from 1 to n, emit in the red and diodes $DV_p$, with p varying from 1 to n, emit in the green. A logic circuit 40 receives signals from the tuning detector 30 and from the light needle control circuit 20, and is associated with the frequency light display device 11, in this case of the light needle type, so that the frequency light indication appears on the frequency light display device 11 according to a first mode in absence of a signal from tuning detector 30 and representing tuning in to a station, and according to at least a second mode visually distinct from the first one in the presence of such a signal. The purpose of logic circuit 40 is then generally to appropriately interconnect the display device, the circuit driving the display, for example of the light needle type, and the tuning detector.

Thus, with the red and green diodes mentioned above, frequency light indication may appear in red if there is no station tuning and in green if there is tuning.

The embodiment of FIG. 2 will now be described in greater detail. The cathodes of all the light-emitting diodes are connected to ground. In fact, the two-diode light-emitting elements are generally in the form of cases in which the cathodes of the two diodes are common. The logic circuit 40 will process in parallel the information supplied by the light needle control circuit 20 and by the tuning detector 30. Let us thus consider any light-emitting element $IL_p$, p varying from 1 to n. The anode of its first diode $DR_p$, which forms its free electrode, is connected to the output of an AND gate $PR_p$. The anode of its second diode $DV_p$, which forms its free electrode, is connected to the output of an AND gate $PV_p$. A first input of AND gate $PR_p$ as well as a first input of AND gate $PV_p$ receive the output $S_p$, of rank p, from the light needle control circuit 20 in accordance with positive logic, that is to say that this signal $S_p$ is at logic level 1 and all the others at logic level 0 when the reception frequency selected corresponds to illumination of element $IL_p$ of the light needle. For example, the light needle control circuit UAA 170 from SIEMENS supplies directly output signals in accordance with a positive logic. On the other hand, the tuning detector which, for example, in frequency modulation, receives the zero of the discriminator of the receiving circuit 10, produces as its output a signal $\overline{A}$ corresponding to tuning in to a station, with negative logic, i.e. that when tuned in to a station, this output $\overline{A}$ is at logic level 0. The tuning detector LB 1450 of SANYO may for example be used. Signal $\overline{A}$ is applied to an inverter $I_1$ whose output is a signal A representing then station tuning with positive logic. Signal $\overline{A}$ is applied to the second input of AND gate $PR_p$ as well of course to all the other analog gates namely $PR_1$, $PR_2$, $PR_3$, ..., $PR_p$, ..., $PR_n$. Similarly, signal A is applied to the second input of each of the gates $PV_1$, $PV_2$, $PV_3$, ..., $PV_p$, ... $PV_n$. Therefore, if a level 1 logic signal is supplied by output $S_p$, p varying from 1 to n, it is diode $DR_p$ which will light up in the absence of station tuning and diode $DV_p$ which will light up in the presence of station tuning. Diodes $PR_p$ and $PV_p$, whatever p'≠p) will not light up since $S_{p'}$,=0. With the above example, the user will see a light element $IL_p$ red in color if there is no station tuning and green in color if there is station tuning.

It will be noted that light-emitting components other than diodes may be used. If their common electrodes are connected to ground, they will be named cathodes and anodes if they are connected to a supply voltage.

FIG. 3 is a variation of FIG. 2, using for example diodes whose anodes are connected to a case forming the light-emitting element $IL_p$. For the sake of simplicity, this figure in fact only shows the light element or rank p, the situation being of course identical for all the other light-emitting elements. The AND gates $PR_p$ and $PV_p$ are simply replaced respectively by inverting AND gates $P'R_p$ and $P'V_p$, which furthermore receive the same signals as in the case of FIG. 2.

FIG. 4 shows a more elaborate version of FIGS. 2 and 3 for obtaining not 2 but 3 display modes for the frequency light indication. For example, for light-emitting elements comprising a red diode and a green diode, the indication will be red in the absence of tuning, orange for approximate tuning by causing both diodes to emit simultaneously, and green in the presence of exact station tuning. For this, the tuning detector 30 receives from the receiving circuit 10, not only the zero from the FM discriminator but also the S curve thereof so as to be able to output, in a way known per se, signals $PA_1$ and $PA_2$ representing an approximate station tuning. For example, the circuit mentioned above by way of example supplies such signals with negative logic, i.e. approximate tuning in to a station produces a logic level 0 at one of the two outputs $\overline{PA_1}$ and $\overline{PA_2}$. In the total absence of tuning or in the case of exact tuning to a station, these two outputs are at level 1. Signal $\overline{PA_1}$ is applied to an inverter $I_2$ which outputs an approximate tuning signal $PA_1$ with positive logic. Signal $\overline{A}$ is applied to the input of an inverter $I_3$ which outputs a station tuning signal A with positive logic, as did the inverter $I_1$ of FIG. 1. The signal $\overline{PA_2}$ is applied to the input of an inverter $I_4$ which outputs an approximate tuning signal $PA_2$ with positive logic. Signals $PA_1$, A and $PA_2$ are applied to the three inputs of an OR gate whose output is a signal A' which will be applied to the second input of gates $PV_p$, with p varying from 1 to n, under the same conditions as signal A in FIG. 2 or FIG. 3. Similarly, the signal $\overline{A}$ is applied to the second input of AND gates $PR_p$ or inverting AND gates $P'R_p$, with p varying from 1 to n. Furthermore, FIG. 4 shows that the tuning detector 30 may possibly receive indications concerning the FM field and the AM field through divider bridges, respectively 12 and 13, which allow the field thresholds to be regulated independently in AM and FM. This conventional arrangement has, as will be recalled, a double advantage. In frequency modulation, this field indication is used for inhibiting the output of the tuning detector, i.e. in the presence of a field which is too weak, the output of the tuning detector will not produce at its output any signal representative of station tuning, whatever may be the situation at the level of the FM discriminator. It may of course be the same in AM. It should however be noted that AM receivers are not in general provided with a discriminator, i.e. that it is not possible to determine when there is exact station tuning. This is not in practice very troublesome, considering the very mediocre quality of this kind of transmission which is well received as soon as the field has a satisfactory level. This is the situation shown in FIG. 4: in the AM position, the tuning detector receives the AM field, but on the other hand a switch short circuits the two inputs of the tuning detector on the discriminator side, which causes the tuning detector 30 to output a signal A equal to 1 if the field is too weak and a signal A equal to 0 if the field reaches a satisfactory level. As for signals $\overline{PA_1}$ and $\overline{PA_2}$ they will always be equal to 1. Conventionally, we can say that a signal $\overline{A}=0$ corresponding to a field exceeding a predetermined threshold, in AM without intervention of a discriminator, is a signal associated with presumed accurate station tuning.

The operation can then be explained in the following way: if there is no station tuning, $\overline{A}$ is equal to 1, so a diode $DR_p$ (with p varying from 1 to n) is lit up, in relation with the corresponding indication of the light needle control circuit (output $S_p$ at level 1). On the other hand, since A=0, as well as $PA_1$ and $PA_2$, the signal A' is equal to 0 and consequently diode $DV_p$ is not lit. There will for example in this case be a red light indication. In the presence of approximate tuning to a station, we have either $PA_1=1$, or $PA_2=1$ and consequently $A'=1$, and furthermore $\overline{A}=1$, which means that the two diodes $DR_p$ and $DV_p$ are lit up simultaneously. This will correspond for example to a light indication orange in color (combination of green and red). In the case where there is station tuning, $\overline{A}=0$ and $A=1$, so $A'=1$, which means that the diode $DV_p$ is alone lit up, which corresponds for example for the user to a light indication green in color.

FIG. 5 shows one embodiment of a three color display using display elements each of which comprises three light emitting diodes. The display element of rank p thus comprises diodes $D_{1p}$, $D_{2p}$ and $D_{3p}$. The signals $\overline{PA_1}$ and $\overline{PA_2}$ supplied by the tuning detector 30 are respectively inverted in inverters $I_6$ and $I_7$. The signals $PA_1$ and $PA_2$ present at the output of the inverters $I_6$ and $I_7$, are applied to the two inputs of an OR gate 42 whose output signal $A''$ is applied to the input of an inverter $I_8$, whose output is then a signal $\overline{A''}$. Signal $\overline{A}$ present at the output of tuning detector 30 is inverted by an inverter $I_5$ whose output is then the signal A. The signals $\overline{A}$ and $\overline{A''}$ are applied to the inputs of an AND gate 43. With the diodes being shown in the common cathode mode, each of the anodes thereof receives the output signal from an AND gate, namely $P_{1p}$ for diode $D_{1p}$, $P_{2p}$ for diode $D_{2p}$ and $P_{3p}$ for diode $D_{3p}$, with p varying from 1 to n. A first input of each of these AND gates $P_{1p}$, $P_{2p}$, $P_{3p}$, receives the corresponding output signal $S_p$ from the light needle control circuit 20. Furthermore, the second input of each AND gate $P_{1p}$ (with p varying from 1 to n) receives the signal A outputted by the inverter $I_5$, the second input of each gate $P_{2p}$ (with p varying from 1 to n) receives the signal present at the output of the AND gate 43, namely $\overline{PA_1}+\overline{PA_2}$. $\overline{A}$, and the second input of each gate $P_{3p}$ (with p varying from 1 to n) receives the signal $A''=PA_1+PA_2$ present at the output of the OR gate 32. Consequently, for a logic level 1 signal present at the output $S_p$ of the light needle control circuit 20, the frequency light indication will be made in three modes. In the case where there is no station tuning, we have $\overline{A}=\overline{PA_1}=\overline{PA_2}=1$, and consequently $\overline{A''}=1$, and the AND gate 43 has its two inputs at level 1 and it is diode $D_{2p}$ which is the only one to be lit up ($A''=A=0$). In the case of approximate station tuning, we have, either $\overline{PA_1}=0$, or $\overline{PA_2}=0$ and consequently $A''=1$, and furthermore $\overline{A}=1$, and consequently $A=0$. Since $A''=1$, and so $\overline{A''}=0$, the output of the AND gate 43 is equal to 0 and diode $D_{3p}$ is the only one to be lit up. Finally, in the case of exact tuning to a station, we have $\overline{A}=0$ and $\overline{PA_1}$ and $\overline{PA_2}=1$, which means that $A=1$, $A''=0$ and $\overline{A''}=1$, so the output of the AND gate 43 is equal to 0; therefore, the diode $D_{1p}$ is the only one to be lit up.

It will be noted, as in the case of FIG. 3, for obtaining operation with diodes whose anode is common it is sufficient to replace the AND gates $P_{1p}$, $P_{2p}$, and $P_{3p}$ by inverting AND gates.

FIGS. 6 to 10 show the variations of the invention in series logic, that is to say that each light-emitting component receives on an electrode a signal corresponding to the logic state of the tuning detector and on the other electrode a signal corresponding to the logic state of the light needle control circuit 20. The light-emitting components must then be diodes or similar components having a preferential actuation direction.

In FIG. 6 then, each display element $IL_p$ (with p varying from 1 to n) is formed of two light-emitting diodes $DR_p$ and $DV_p$, whose cathodes are connected together. This common cathode receives the signal $\overline{S}_p$ corresponding to the $p^{th}$ output of the light needle control circuit 20 with negative logic, that is in this case after inversion by an inverter $I_{10+p}$. The diodes $DR_p$ (with p varying from 1 to n) receive at their anodes the signal $\overline{A}$ from the tuning detector. The diodes $DV_p$ (with p varying from 1 to n) receive at their anodes the signal A representing tuning in to a station in accordance with positive logic, i.e. after inversion by an inverter $I_9$. The light indication of the level of the $p^{th}$ display element $IL_p$ is provided in the following way: for $S_p=1$, we have $\overline{S}_p=0$; if there is no station tuning, we have $\overline{A}=1$, and it is diode $DR_p$ which lights up; on the other hand, if there is station tuning, we have $A=1$ and it is diode $DV_p$ which lights up. The other diodes remain unlit in any case since we have $S_{p'}=1$ (whatever p' is different from p), which means that the diodes $DR_{p'}$ and $DV_{p'}$ are either reversely biassed or receive at each of their electrodes a signal corresponding to a logic level 1.

FIG. 7 shows a circuit equivalent to that of FIG. 6 in the case where it is the anodes of the diodes of the display element $I'L_p$ which are connected together. In this case, the common anode of the display element $I'L_p$ receives the output $S_p$ of the light needle control circuit 20 (p varying from 1 to n). The cathode of each diode $DV_p$ (with p varying from 1 to n) receives the signal $\overline{A}$ from the tuning detector 30 and the cathode of each diode $DR_p$ (with p varying from 1 to n) receives the signal A from the tuning detector, in accordance with positive logic, i.e. after inversion by an inverter $I_{10}$. The display of a frequency by the $p^{th}$ display element is then achieved in the following way: we have on the one hand $S_p=1$, which means that, in the absence of tuning, $A=0$ and consequently diode $D'R_p$ is lit up whereas, in the presence of tuning, $\overline{A}=0$ and it is the diode $D'V_p$ which is lit up; for the elements p' with $p'\neq p$, the outputs $S_{p'}$ are at level 0 and none of the diodes can light up.

FIG. 8 shows the diagram of FIG. 6 adapted to a three color display by means of twin light-emitting diode display elements. The identical parts are shown with the same references. Furthermore, the tuning detector 30 receives the FM discriminator and field signals under the same conditions as in FIGS. 4 and 5. The power supply for the cathodes of the diodes is provided by circuit 20 as in the case of FIG. 6 (inverters $I_{10+p}$). The signals $\overline{PA_1}$, $\overline{A}$ and $\overline{PA_2}$ are respectively inverted by inverters $I_{11}$, $I_{12}$ and $I_{13}$, whose outputs are applied to the three inputs of an OR gate 44 which outputs a signal $A'=(PA_1+A+PA_2)$. Furthermore, the signal A present at the output of gate $I_{12}$ is again inverted by inverter $I_{14}$ which thus outputs a signal $\overline{A}$. The purpose of this arrangement, apparently redundant, is to produce a better deinfed output level and this arrangement could also be applied to the cases of FIGS. 6 and 7 described above. Moreover, in the case where the tuning detector 30 does not involve TTL logic, the inputs of inverters $I_{11}$ to $I_{13}$ are connected to a power supply source $+V$ through resistors R so as to fix logic level 1. Signal $\overline{A}$ is applied to the anode of each of the diodes $DR_p$ (with p varying from 1 to n). Signal $A'$ is applied to the anode of each of the diodes $DV_p$ (with p varying from 1 to n). In the absence of station tuning, we have $\overline{A}=1$ and $A'=0$ and so diode $DR_p$ lights up if $S_p$ is equal to 1. In the case of approximate tuning to a station, we still have $\overline{A}=1$, but on the contrary either $PA_1$ or $PA_2$ is equal to 1 and so A' is itself equal to 1, which means that the diodes $DR_p$ and $DV_p$ are caused to light up simultaneously. With station tuning we have A=1 and so A''=1 and $\overline{A}$=0, which means that diode $DV_p$ will be the only one lit up.

FIG. 9 is a variation of FIG. 8 but corresponding to the cases already described in FIG. 7 where the anodes of the diodes of each display element are connected together. Thus, the OR gate 44 is replaced by an inverting OR gate 45 which also receives at its inputs the signals $PA_1$, A and $PA_2$. The cathode of each diode $D'R_p$ (with p varying from 1 to n) receives the signal A, whereas the cathode of each diode $D'V_p$ (with p varying from 1 to n) receives the signal $\overline{A'} = \overline{(PA_1 + A + PA_2)}$ present at the output of the inverting OR gate 45.

FIG. 10 shows a series logic variation in the case where each display element $IL_p''$ with p varying from 1 to n) comprises three light-emitting diodes $D_{1p}$, $D_{2p}$ and $D_{3p}$, whose cathodes are connected together and to the output $\overline{S}_p$ of the light needle control circuit 20, with negative logic, i.e. after inversion by a gate $I_{20+p}$. The signals $\overline{PA}_1$ and $\overline{PA}_2$ from the tuning detector are inverted respectively by inverters $I_{16}$ and $I_{17}$ whose outputs $PA_1$ and $PA_2$ are applied to an OR gate 46 whose output $A'' = PA_1 + PA_2$ is applied in its turn to an inverter $I_{18}$ so as to produce an output $\overline{A}''$. Furthermore, the signal $\overline{A}$ present at the output of the tuning detector 30 is inverted by an inverter $I_{15}$ so as to output a signal A. The signals $\overline{A}$ and $\overline{A}''$ are applied to the inputs of an AND gate 47. The anode of each diode $D_{1p}$ (with p varying from 1 to n) receives the signal A, the anode of each diode $D_{2p}$ (with p varying from 1 to n) receives the output of the AND gate 47, i.e. $\overline{(PA_1 + PA_2)}$. A, and the anode of each diode $D_{3p}$ (with p varying from 1 to n) receives the signal A'' present at the output of the OR gate 46. The light indication is then obtained according to an operating mode similar to that of FIG. 5.

For operation of the diodes with commonly connected anodes, signals A, A' and $\overline{(PA_1 + PA_2)}$. A, applied to the diodes this time at their cathodes, must of course be replaced by their inversions. The AND gate 47 becomes for example an inverting AND gate, and the output of inverter $I_{18}$ is connected to the cathode of the third diode.

FIG. 11 illustrates the different configurations of the input signals which the tuning detector 30 may receive. Since frequency modulation receivers are usually provided with a discriminator, the tuning detector 30 receives through a circuit 14 the zero of the FM discriminator. It also receives, in the case of three color display, the S curve of the FM discriminator, so as to be able to produce signals such as $PA_1$ and $PA_2$. In so far as amplitude modulation is concerned, it is also possible to use an amplitude modulation discriminator whose zero will be transmitted through a circuit 16, and for three color tuning display, the S curve of the discriminator through a circuit 17. There is also shown in FIG. 11 switches for switching alternately in or out the AM discriminator and the FM discriminator with respect to the inputs of the tuning detector 30. Tuning detector 30 may also receive the FM field through a circuit 31 and the AM field through a circuit 32, a switch connected to the preceding one providing the switching. It will be recalled that these field indicators inhibit the indication of tuning or approximate tuning at the output of the tuning detector in the presence of a field which is weak. It is then a question of a device generally used but which is not indispensable within the scope of the invention.

Furthermore, within the scope of the invention, a light needle control circuit may be used having discrete elements or integration of the whole of the electronic means may be provided.

What is claimed is:

1. A receiver comprising:
   a receiving circuit for tuning said receiver to a desired reception frequency and detecting any transmitted signal at said desired reception frequency;
   a tuning detector having an input coupled to said receiving circuit for receiving a signal indicative of a detected signal and providing a tuning detector signal corresponding thereto;
   a light needle control circuit having an input coupled to said receiving circuit for receiving therefrom a signal representing said desired reception frequency and providing a light needle control signal at one of a plurality of outputs thereof and corresponding thereto;
   a logic circuit having a plurality of first inputs coupled to corresponding outputs of said light needle control circuit and a second input coupled to said output of said tuning detector and a plurality of outputs, each output being capable of providing at least two different signals depending upon whether or not said tuning detector indicates receipt of a transmitted signal; and
   a light needle display having a plurality of display elements, each display element having two light emitting components for emitting light in at least two different colors, each display element being coupled to a corresponding output of said logic circuit, whereby the particular display element emitting light indicates the frequency to which said receiving circuit is tuned and the color indicates whether a transmitted signal is being received by said receiving circuit.

2. A receiver according to claim 1 wherein each display element comprises first and second light emitting diodes, each having an anode and a cathode.

3. A receiver according to claim 2 wherein said cathodes are coupled together and wherein said logic circuit comprises two (2) AND gates corresponding to each display element, the output from each AND gate being coupled to an anode of one of said light emitting diodes, each gate having a first input coupled to one of the outputs of said needle control circuit, and further comprising means for providing a positive logic signal from said tuning detector to a second input of one of said two gates and a negative logic input to the second input of the other of said two gates.

4. A receiver according to claim 2 wherein said anodes are coupled together and wherein said logic circuit comprises two (2) inverting AND gates corresponding to each display element, the output from each AND gate being coupled to an cathode of one of said light emitting diodes, each gate having a first input coupled to one of the outputs of said needle control circuit, and further comprising means for providing a positive logic signal from said tuning detector to a second input of one of said two gates and a negative logic input to the second input of the other of said two gates.

5. A receiver according to claim 1 wherein said receiving circuit comprises an FM receiving circuit having an FM discriminator and wherein said tuning detector receives a signal from said discriminator.

6. A receiver according to claim 5 wherein said signal from said discriminator comprises a "zero" signal and an "S curve" signal.

7. A receiver according to claim 5 wherein said tuning detector receives from said FM discriminator an FM field signal and provides no output signal when the field signal does not meet predetermined criteria.

8. A receiver according to claim 1 wherein said tuning detector comprises means for generating signals indicative of exact and approximate station tuning.

9. The receiver as claimed in claim 8, wherein each said display element is formed from two light-emitting diodes, wherein a first diode of each said display element receives the exact or approximate tuning signal with a first type logic and wherein the second diode of each said display element receives the exact or approximate tuning signal with a second type logic inverted with respect to the first type logic.

10. A receiver according to claim 1 wherein said receiving circuit is an AM receiving circuit having an AM detector.

11. A receiver according to claim 10 wherein said tuning detector receives from said AM detector an AM field signal.

12. A receiver comprising:
 a receiving circuit for tuning said receiver to a desired reception frequency and detecting any transmitted signal at said desired reception frequency;
 a tuning detector having an input coupled to said receiving circuit for receiving a signal indicative of a detected signal and providing three (3) output signals corresponding thereto and representing no detected signal, approximate station tuning and exact station tuning, respectively;
 a light needle control circuit having an input coupled to said receiving circuit for receiving therefrom a signal representing a said desired reception frequency and providing a signal at one of a plurality of outputs thereof corresponding thereto;
 a logic circuit having a plurality of first inputs coupled to corresponding outputs of said light needle control circuit and a second input coupled to said output of said tuning detector and a plurality of outputs, each output being capable of providing at least two different signals depending upon whether said tuning detector indicates reception of a transmitted signal; and
 a light needle display having a plurality of display elements, each display element having three light emitting components for emitting light in at least three different colors, each display element being coupled to a corresponding output of said logic circuit, whereby the particular display element emitting light indicates the frequency to which said receiving circuit is tuned and the color indicates whether (1) no transmitted signal is being detected by said receiving circuit, (2) there is approximate station tuning, or (3) there is exact station tuning.

13. A receiver according to claim 12 wherein each display element comprises first, second and third light emitting diodes, each having an anode and a cathode.

14. A receiver according to claim 13 wherein said cathodes are coupled together and wherein said logic circuit comprises three (3) AND gates corresponding to each display element, the output from each AND gate being coupled to an anode of one of said light emitting diodes, each gate having a first input coupled to one of the outputs of said needle control circuit,
 a second input of the first gate receiving the exact or approximate tuning signals, a second input of the second gate receiving a logic product of a exact tuning signal with the logic sum of the complements of the approximate and exact tuning signals and the second input of the third gate receiving the approximate tuning signal whereby the particular color of a display element indicates no station tuning, approximate station tuning or exact station tuning.

15. A receiver according to claim 13 wherein said anodes are coupled together and wherein said logic circuit comprises three (3) inverting AND gates corresponding to each display element, the output from each AND gate being coupled to an anode of one of said light emitting diodes, each gate having a circuit,
 a second input of the first gate receiving the exact or approximate tuning signals, a second input of the second gate receiving a logic product of a exact tuning signal with the logic sum of the complements of the approximate and exact tuning signals and the second input of the third gate receiving the approximate tuning signal whereby the particular color of a display element indicates no station tuning, approximate station tuning or exact station tuning.

16. A receiver comprising:
 a receiving circuit for tuning said receiver to a desired reception frequency and detecting any transmitted signal at said desired reception frequency;
 a tuning detector having an input coupled to said receiving circuit for receiving a signal indicative of a detected signal and providing a tuning detector signal corresponding thereto;
 a light needle control circuit having an input coupled to said receiving circuit for receiving therefrom a signal representing said desired reception frequency and providing a light needle control signal at one of a plurality of outputs thereof and corresponding thereto;
 a logic circuit having a plurality of first inputs coupled to corresponding outputs of said light needle control circuit and a second input coupled to said output of said tuning detector and a plurality of outputs,
 a light needle display having a plurality of display elements, each display element having two light emitting components for emitting light in at least two different colors, the two light emitting components of each display element having one electrode coupled to each other, said coupled electrodes being coupled to a corresponding output of said logic circuit, the opposite electrode of one of said light emitting components being coupled to receive said tuning detector signal and the other opposite electrode of said other light emitting component being coupled to said logic circuit.

17. A receiver according to claim 16 wherein said electrodes coupled to each other are cathodes and wherein the anode of one component is coupled to receive said tuning detector signal and the anode of the other component receives a signal from said logic circuit.

18. A receiver according to claim 16 wherein said common electrode is an anode and wherein the cathode of one component is coupled to receive said tuning detector signal and the cathode of the other component receives a signal from said logic circuit.

* * * * *